US006861871B1

(12) United States Patent
Agrawal et al.

(10) Patent No.: US 6,861,871 B1
(45) Date of Patent: Mar. 1, 2005

(54) CASCADED LOGIC BLOCK ARCHITECTURE FOR COMPLEX PROGRAMMABLE LOGIC DEVICES

(75) Inventors: Om P. Agrawal, Los Altos, CA (US); Paul R. Bonwick, Corsham (GB); Chan-Chi Jason Cheng, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/428,885

(22) Filed: May 1, 2003

(51) Int. Cl.[7] ............................................. H03K 19/177
(52) U.S. Cl. ............................. 326/41; 326/38; 326/39
(58) Field of Search .............................. 326/41, 38, 39, 326/40, 47

(56) References Cited

U.S. PATENT DOCUMENTS

| | | | | |
|---|---|---|---|---|
| 5,966,027 A | * | 10/1999 | Kapusta et al. | 326/41 |
| 6,100,714 A | * | 8/2000 | Xiao et al. | 326/41 |
| 6,184,713 B1 | | 2/2001 | Agrawal et al. | |
| 6,259,273 B1 | * | 7/2001 | Yin et al. | 326/41 |
| 6,348,813 B1 | * | 2/2002 | Agrawal et al. | 326/41 |

OTHER PUBLICATIONS ispMACH 5000VG Family, 3.3V In–System Programmable SuperBIG, SuperWIDE High Denisty PLDs Datasheet, Lattice Semiconductor Corporation, Dec. 2001.
ispPLD 5000MX Family, 3.3V, 2.5V and 1.8V In–System Programmable eXpanded Programmable Logic Device XPLD Family Datasheet, Lattice Semiconductor Corporation Mar. 2003.

ispMACH 4000V/B/C/Z Family Data Sheet, Lattice Semicoanductor Corpration, 2003, pp. 1–82 Jan. 2003.

U.S. patent appl. entitled "Programmable Logic Device With Enhanced Wide And Deep Logic Capability", given ser. No. 10/428,982, filed on May 1, 2003 (Our docket No. M–15104 US).

U.S. patent Appl. entitled "CLPD with Multi–Function Blocks And distributed Memory", given ser. No. 10/428,889, filed on May 1, 2003 (Our docket No. M–15103 US).

U.S. patent appl. entitled "Multi–Stage Interconnect Architecture For Complex Programmable Logic Devices", given ser. No. 10/428,888, filed on May 1, 2003 (Our docket No. M–15100 US).

* cited by examiner

Primary Examiner—Michael Tokar
Assistant Examiner—Lam T. Mai
(74) Attorney, Agent, or Firm—MacPherson Kwok Chen & Heid LLP; Grey J. Michelsoi

(57) ABSTRACT

Cascadable logic block architectures are disclosed for programmable logic devices, such as for high density and high performance complex programmable logic devices. The logic block architectures provide, for example, clusters or groups of logic blocks that may have cascadable inputs and/or product terms to provide flexible logic width and/or depth capability. The logic block architecture may, for example, be implemented in conjunction with a multi-stage interconnect architecture to provide array fuse density and/or interconnect fuse density savings compared to conventional architectures.

20 Claims, 5 Drawing Sheets

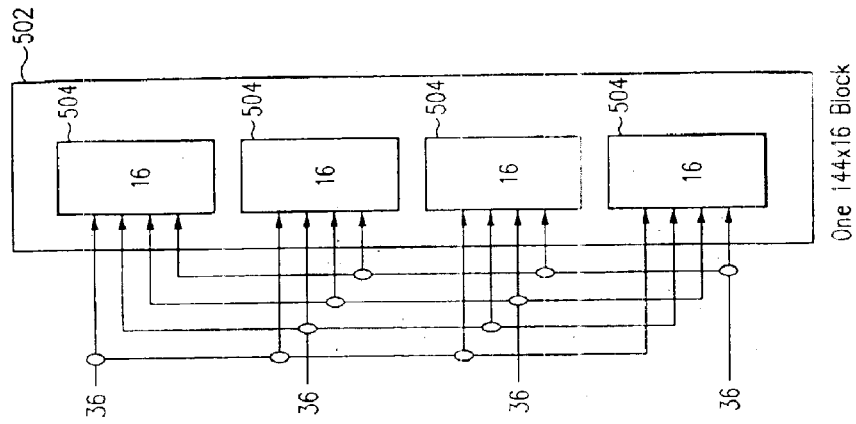
FIG. 5c One 144x16 Block
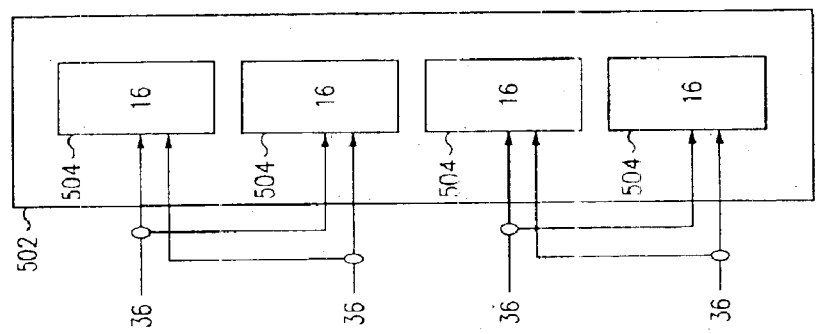
FIG. 5b Two 72x16 Blocks
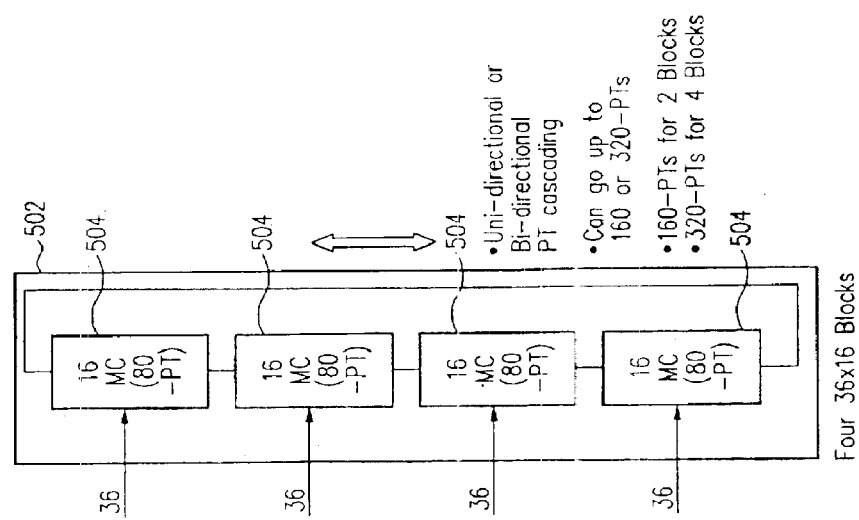
FIG. 5a Four 36x16 Blocks
- Uni-directional or Bi-directional PT cascading
- Can go up to 160 or 320-PTs
- 160-PTs for 2 Blocks
- 320-PTs for 4 Blocks ns to the logic block and the associated multiplexer structure. Generally, logic blocks having more inputs tend to be more interconnect efficient in terms of circuit area than logic blocks having fewer inputs, because there can be relatively fewer multiplexers and fewer interconnect fuses.

CASCADED LOGIC BLOCK ARCHITECTURE FOR COMPLEX PROGRAMMABLE LOGIC DEVICES

TECHNICAL FIELD

The present invention relates generally to electrical circuits and, more particularly, to logic block architectures for integrated circuits and especially for complex programmable logic devices.

BACKGROUND

Programmable logic devices, such as for example a complex programmable logic device, are well known and are employed in numerous types of applications. A complex programmable logic device (CPLD) typically includes a number of monolithic and independent logic blocks interconnected by a global or centralized routing structure. One example of such a device is shown and described in U.S. Pat. No. 6,184,713, which is incorporated herein by reference in its entirety.

For example, FIG. 1 illustrates a block diagram of a conventional CPLD that includes a routing structure 100 and logic blocks 102 (sixteen independent logic blocks 102), with each logic block 102 having 16 macrocells and receiving 36 inputs from routing structure 100. The architecture of the logic block and of the routing structure (or interconnect) are two significant factors that determine the density, performance, and scalability of a CPLD.

As an example, a logic block architecture may include a programmable AND array to assist in providing AND-OR product term based logic (sum of products). The AND array generally has a large number of fuses, such as for example 2 (N)(M)(P) fuses, where "N" is the number of inputs to the logic block, "M" is the number of macrocells in the logic block, and "P" is the average number of product terms per macrocell. One drawback of this logic block architecture is that the number of fuses generally required (i.e., array fuse density or array fuse count) increases rapidly for higher density CPLDs with wide input logic blocks. Thus, smaller logic blocks tend to be more area efficient in terms of the number of fuses that are required for the AND array for a given number of macrocells.

A logic block may be measured in terms of its logic width capability (number of inputs) and its logic depth capability (number of product terms). Generally, a CPLD logic block has a fixed input width and a fixed number of product terms. Consequently, logic functions requiring more inputs or more product terms than are available from the logic block typically must be routed through the routing structure numerous times. This results in reduced performance and contributes to congestion in the routing structure.

As noted above, a CPLD routing structure architecture typically includes a centralized or global routing structure, which attempts to emulate to some extent a full cross-point switch to route various signals (e.g., macrocell feedback signals, input/output (I/O) feedback signals, or dedicated input signals) to appropriate logic blocks within the CPLD. As an example, a typical CPLD utilizes a multiplexer-based routing scheme to maximize speed while minimizing signal blocking (i.e., maximize routing capability). Each logic block generally receives all of its inputs from the routing structure via an associated, independent, and separate single-level multiplexer-based structure.

An interconnect fuse density associated with this routing structure is affected by the number of inputs to the logic block and the associated multiplexer structure. Generally, logic blocks having more inputs tend to be more interconnect efficient in terms of circuit area than logic blocks having fewer inputs, because there can be relatively fewer multiplexers and fewer interconnect fuses.

Because of the limitations noted above, CPLDs having small logic blocks (e.g., logic blocks with narrow inputs, such as for example 36 inputs that are typically associated with low density devices) are difficult to scale to higher densities, because of the poor interconnect efficiency (e.g., high interconnect fuse density) associated with the smaller logic blocks. On the other hand, CPLDs having large logic blocks (e.g., logic blocks with wide inputs, such as for example 68 inputs that are typically associated with high density devices) are difficult to scale to higher densities, because of the poor array efficiency (e.g. high array fuse density) associated with the larger logic blocks. Furthermore, logic block architectures having fixed logic width and/or depth have limited flexibility and may contribute to routing congestion. As a result, there is a need for an improved logic block architecture that may also provide the array efficiency associated with small logic block architectures and the interconnect efficiency associated with large logic block architectures.

SUMMARY

Systems and methods are disclosed herein for providing improved logic block architectures. For example, in accordance with one embodiment of the present invention, a cascadable logic block architecture is disclosed, which may be applicable for high density and high performance programmable logic devices (e.g., CPLDS). The cascadable logic block architecture may provide optimization of an array fuse density normally associated with smaller logic blocks and/or may also allow optimization of an interconnect fuse density normally associated with larger logic blocks to provide a scalable high density programmable logic device architecture.

The cascadable logic block architecture, for example, includes clusters of logic blocks that have cascadable inputs and/or cascadable product terms. Furthermore, the cascadable logic block architecture may be supported by a multistage interconnect architecture having a local feedback path for improved performance.

More specifically, in accordance with one embodiment of the present invention, a programmable logic device includes a routing structure adapted to route signals within the programmable logic device a plurality of logic blocks, coupled to the routing structure, adapted to provide flexible width and depth capability; and wherein the plurality of logic blocks are arranged into a plurality of clusters, with each cluster having at least two of the logic blocks.

In accordance with another embodiment of the present invention, a cascadable logic block architecture within a programmable logic device includes a cluster of logic blocks, with each of the logic blocks adapted to provide a variable input width and/or a variable product term depth in conjunction with the remaining logic blocks within the cluster, wherein each of the logic blocks includes a programmable AND array adapted to receive input signals and provide a number of product terms; a plurality of AND gates, coupled to the programmable AND array, adapted to receive the product terms from the programmable AND array and from the logic blocks within the cluster and provide input cascading; a plurality of OR gates, coupled to the programmable AND array and the plurality of AND gates, adapted to sum product terms provided by the programmable AND array and/or the plurality of AND gates; a second plurality of OR gates, coupled to the plurality of OR gates, adapted to receive the sum of product terms from the plurality of OR gates and from the logic blocks with the cluster and provide product term cascading; and a plurality of macrocells, coupled to the plurality of OR gates and the second plurality of OR gates and adapted to receive their output signals.

In accordance with another embodiment of the present invention, a method of cascading logic blocks in a programmable logic device includes providing a plurality of logic blocks; arranging the plurality of logic blocks into clusters, with at least two logic blocks per cluster; and adapting the logic blocks to have a programmable number of inputs and a programmable number of product terms by cascading the logic blocks within their cluster.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 5a, 5b, and 5c illustrate exemplary cascading for cluster-based logic blocks in accordance with an embodiment of the present invention.

The preferred embodiments of the present invention and their advantages are best understood by referring to the detailed description that follows. It should be appreciated that like reference numerals are used to identify like elements illustrated in one or more of the figures.

DETAILED DESCRIPTION

Systems and methods are disclosed for providing logic block architectures within a programmable logic device (e.g., a CPLD). The logic block architectures (e.g., the number of logic blocks and the number of inputs that each receives) along with its associated interconnect structure may provide array fuse density efficiencies and/or interconnect fuse density efficiencies to a greater extent than conventional interconnect architectures. These efficiencies may allow greater scalability to higher density devices. The logic blocks may be cascadable in terms of their inputs and/or product terms. Furthermore, interconnect performance may be improved by providing a local feedback path for a logic block that bypasses the routing structure, as described further herein.

In accordance with one or more embodiments of the present invention, logic blocks are arranged in clusters (also referred to as groups), such that for example, each logic block in the cluster (group) may be utilized as a separate logic block or cascaded with other logic blocks within its cluster such that they all serve to function as one relatively large logic block (e.g., a large virtual logic block). The cluster-based logic blocks with an exemplary two-stage interconnect may further provide array fuse efficiency relative to a conventional large logic block and interconnect fuse efficiency relative to a conventional smaller logic block due to the optional virtual logic block nature of the cluster-based logic blocks and the signals being provided via the two-stage interconnect.

Figure 1:
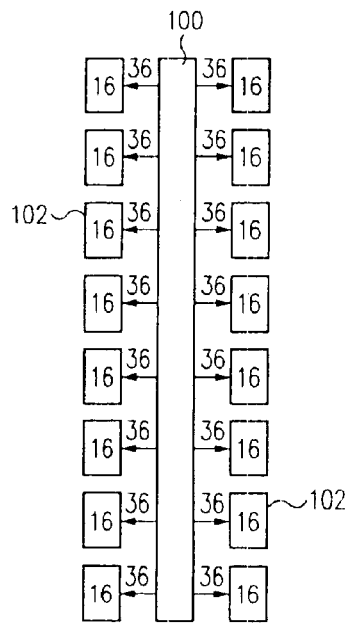
FIG. 1 shows a block diagram illustrating a conventional complex programmable logic device.
Figure 2A:
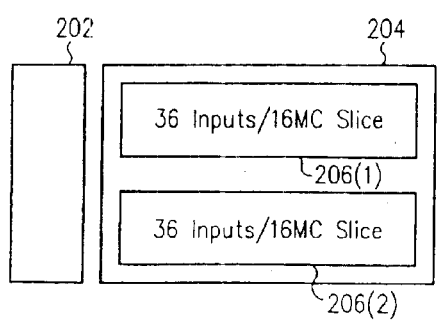
FIGS. 2a and 2b show block diagrams illustrating cluster-based logic blocks in accordance with an embodiment of the present invention.
Figure 2B:
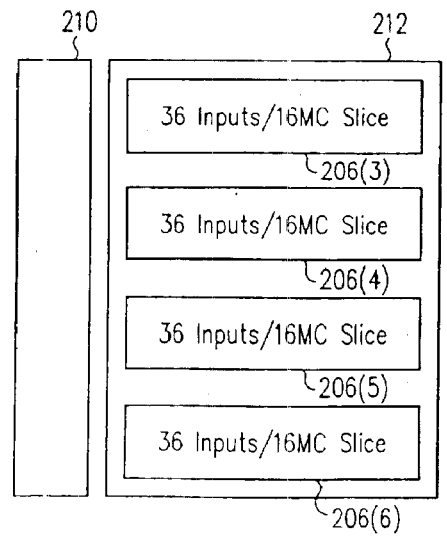

For example, FIGS. 2a and 2b show block diagrams illustrating exemplary cluster-based logic blocks in accordance with an embodiment of the present invention. Specifically, FIG. 2a includes a routing structure 202 and logic blocks 206, which form a cluster 204. Routing structure 202 provides centralized or global routing within the programmable logic device and also, for example in conjunction with an optional exemplary two-stage interconnect as discussed further herein, provides signals (e.g., data, programming, or control) to logic blocks 206.

As shown in an exemplary fashion, cluster 204 includes two of logic blocks 206, but this is not limiting and cluster 204 could include more than two logic blocks 206, such as for example three, four, or eight. For example, FIG. 2b illustrates a routing structure 210 (similar to that of routing structure 202 in FIG. 2a) serving a cluster 212 having four logic blocks 206.

Each logic block 206 may also be referred to herein as a slice or a logic slice that, for example, receives a number of inputs and includes a number of macrocells to provide a desired logical output. The number of inputs and the number of macrocells may be any number, depending upon the intended application, and is not limiting.

Logic blocks 206 may each function as separate logic blocks or combined within their cluster to function as a larger logic block. For example, each logic block 206 within cluster 204 (with logic blocks 206 separately referenced as logic block 206(1) and 206(2)) may function as a 36 input, 16 macrocell logic block or each logic block 206 may have their inputs cascaded to function as one 72 input, 16 macrocell logic block. As a specific example, logic block 206(1) may combine its product terms (PTs) with logic block 206(2) by performing a logical AND operation with corresponding product terms from logic block 206(2) (described in further detail herein) resulting in logic block 206(1) becoming a 72 input/16 macrocell logic block. The 16 macrocells of logic block 206(2) may go unused or also receive its associated product terms, which were routed to logic block 206(1), to provide a desired logical function. Thus, logic blocks 206 may have a flexible logic width capability.

As another example, if each macrocell receives five product terms, then each logic block 206 receives 80 product terms that may be associated with the inputs, with cluster 204 having 80 product terms per logic block 206 or 160 product terms when the product terms of logic blocks 206 are cascaded (i.e., combined together). As a specific example, logic block 206(1) may combine its product terms (PTs) with logic block 206(2) by performing a logical OR operation with corresponding or desired product terms from logic block 206(2) (described in further detail herein) resulting in logic block 206(1) becoming, for example, a 160 product term/16 macrocell logic block. The 16 macrocells of logic block 206(2) may go unused or also receive its associated product terms, which were routed to logic block 206(1), to provide a desired logical function. Thus, logic blocks 206 may have a flexible logic depth capability.

Similarly, each logic block 206 within cluster 212 may function as a 36 input, 16 macrocell logic block or logic blocks 206 may be combined to function as two 72 input, 16 macrocell logic blocks (and optionally also two 36 input, 16 macrocell logic blocks), one 108 input, 16 macrocell logic block and one 36 input, 16 macrocell logic block (and optionally also two 36 input, 16 macrocell logic blocks), or as one 144 input, 16 macrocell logic block (and optionally also three 36 input, 16 macrocell logic blocks or some cascaded combination of the three potentially unused logic blocks). As discussed similarly above and assuming five product terms per macrocell, cluster 212 may have 80 product terms per logic block 206 or 160, 240, or 320 product terms, with cluster 212 functioning as one virtual logic block when product terms of logic blocks 206 (which are separately referenced as logic blocks 206(3) through 206(6)) are selectively cascaded.

Thus, a variable cluster size (e.g., number of logic blocks and number of inputs and product terms per logic block) may be designed or implemented, depending upon the application, to support variable width and depth of logic. Furthermore, various sized programmable logic devices may be derived from the same basic interconnect and logic block architecture with a range from low to high density due to the scalable nature, with the number of clusters and the number of logic blocks per cluster variable.

Figure 3:
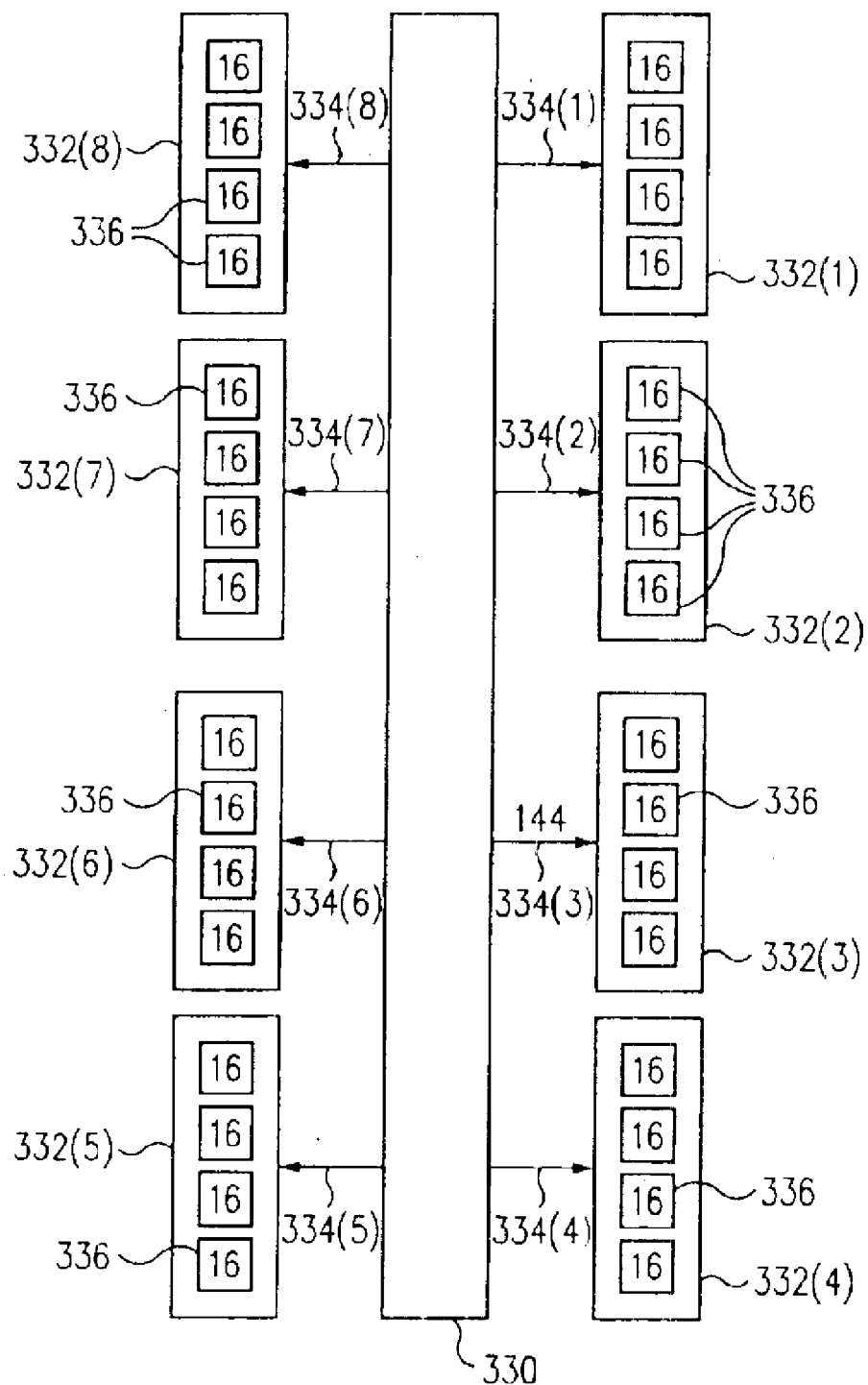
FIG. 3 shows a block diagram illustrating a number of cluster-based logic blocks in accordance with an embodiment of the present invention.

The architecture discussed in reference to FIGS. 2a and 2b may be applied to a device having multiple clusters. For example, FIG. 3 illustrates an architecture having a routing structure 330 and clusters 332 (which are separately referenced as 332(1), 332(2), . . . , through 332(8)). As shown, there are four logic blocks 336 per cluster 332, which can be cascaded as discussed herein (e.g., in reference to FIG. 2b). Logic blocks 336 may have 16 macrocells, as indicated in FIG. 3, or any number of macrocells, such as for example, 8 or 32. Furthermore, the number of inputs and associated product terms may be variable, as noted above, and are not limited to any number (e.g., there may be 144 inputs per cluster as indicated in FIG. 3, but this is merely an example and is not limiting).

As a specific example, FIG. 3 may represent a 512 macrocell device formed into eight clusters 332 of logic blocks 336. Each cluster 332 includes four 16 macrocell cascadable logic blocks 336, with each logic block 336 having 36 inputs and 83 product terms (with three of the product terms for control or clock functions). Logic blocks 336 are cascadable in terms of their inputs and product terms within their associated cluster 332.

As an example, there are eight two-stage interconnects (not shown) that provide signals to each of the corresponding eight clusters 332. As shown in FIG. 3, signal paths 334(1) through 334(8) represent signal paths provided by, for example, eight two-stage interconnects to corresponding clusters 332(1) through 332(8), respectively. As an example, a first stage of the two-stage interconnect may include a switch matrix (e.g., a partially populated switch matrix) that routes a number of signals from routing structure 330 and provides these signals to a second stage of the two-stage interconnect. The second stage may include a switch matrix (e.g., a partially or a fully populated switch matrix) that routes the signals received from the first stage, as well as optionally signals from associated macrocells and input/output (I/O) pin signals, to its associated logic blocks 336.

Figure 4:
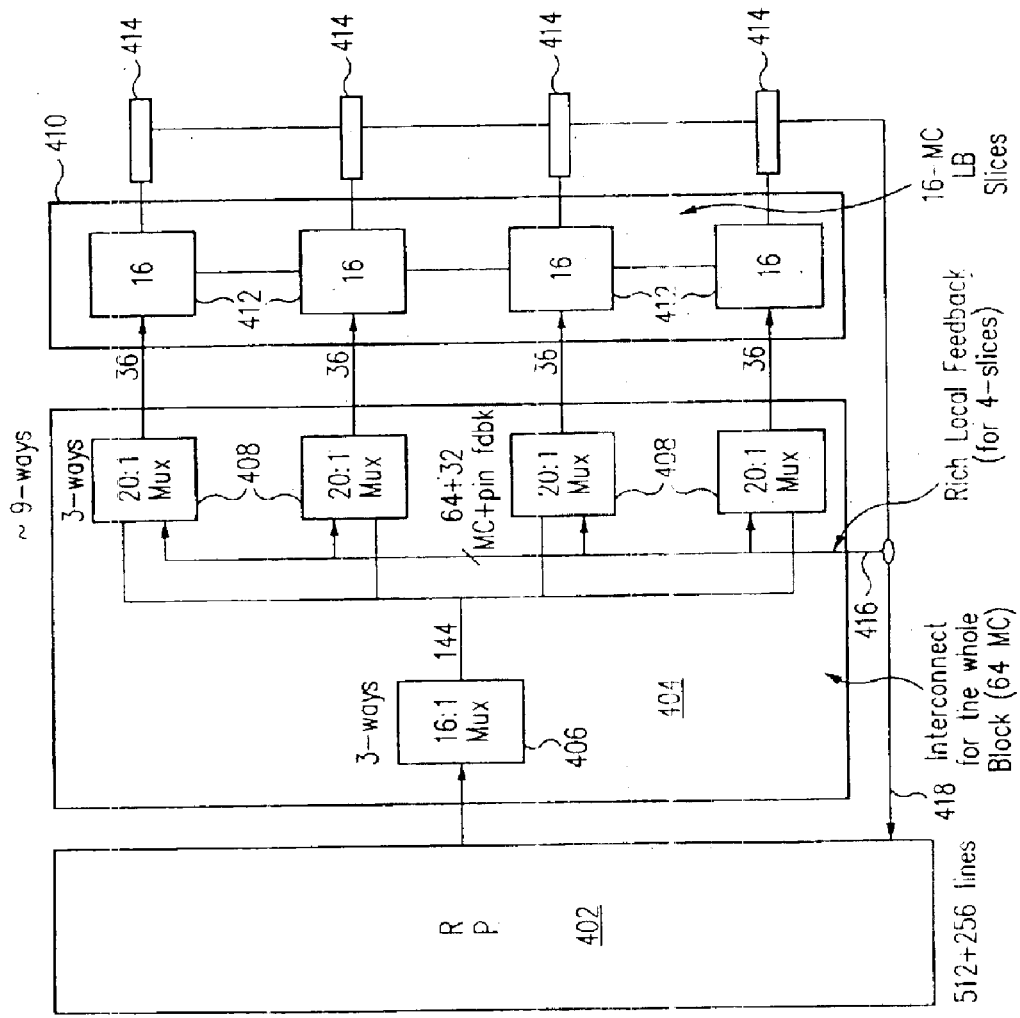
FIG. 4 shows a block diagram of an exemplary implementation of a two-stage interconnect for cluster-based logic blocks in accordance with an embodiment of the present invention.

For example, FIG. 4 shows an exemplary implementation of a two-stage interconnect structure for cluster-based logic blocks in accordance with an embodiment of the present invention. It should be understood that FIG. 4 is an exemplary implementation and that the number of signals for a given signal path as well as switch matrix ratios (e.g., 16:1 multiplexer or mux) and number of logic blocks and number of macrocells, inputs, and product terms per logic block are not limiting and may be varied as a specific design, implementation, or application requires.

Specifically, FIG. 4 shows a routing structure 402, a two-stage interconnect 404, and a cluster 410. Routing structure 402 assists in routing signals to and from and/or within the programmable logic device. Two-stage interconnect 404 routes selected signals from routing structure 402 to cluster 410. In this exemplary implementation, cluster 410 has four logic blocks 412, with each having 16 macrocells and 36 inputs (as discussed similarly for cluster 212 and cluster 332 in FIGS. 2b and 3, respectively).

Two-stage interconnect 404 includes a first switch matrix 406 (representing a first stage) and a number of second switch matrices 408 (representing a second stage). For example, there may be one second switch matrix 408 for each corresponding logic block 412, with each second switch matrix 408 functioning as a local routing structure for its corresponding logic block 412. First switch matrix 406, which functions as a number of multiplexers, routes selected signals from routing structure 402 to second switch matrices 408.

For example, first switch matrix 406 may be a partially populated programmable switch matrix that selectively routes one signal from each of 144 groups of sixteen signal paths, from routing structure 402 having 768 signal paths (e.g., interconnect lines), to corresponding ones of 144 signal paths, which are routed to second switch matrices 408. For this example, first switch matrix 406 functions as 144 16:1 multiplexers, with each of the 768 signal paths being selectably routable through any of three multiplexers out of the 144 multiplexers. Thus, for this example, first switch matrix 406 provides three-way routability (i.e., 144 output signals with 16 choices per output signal from 768 input signals, or 16*144/768, which provides three different signal paths for each input signal) from routing structure 402 to second switch matrices 408.

It should be understood that three-way routability for first switch matrix 406 is exemplary and that the degree of routability may be varied, such as for example to provide two-way, 2.5-way, four-way, or five-way routability (or more). First switch matrix 406 may also be a fully populated switch matrix, but this would require a large number of fuses and utilize a large amount of integrated circuit area.

Second switch matrices 408 route signals received from first switch matrix 406 to logic blocks 412 within cluster 410. Second switch matrices 408 also may route signals from I/O terminals 414 (i.e., terminals, leads, pins, or other types of connectable points for providing I/O paths for the integrated circuit, which circuitry shown in FIG. 4 forms a part of) and/or signals from logic blocks 412 via leads 416 to one or more of logic blocks 412. Logic blocks 412 perform the desired logic function on the received signals and provide output signals which may be routed to I/O terminals 414, second switch matrices 408, and/or routing structure 402. The signals from I/O terminals 414 and logic blocks 412 may also be provided to routing structure 402 via leads 418.

As a specific example (illustrated in FIG. 4), first switch matrix 406 of two-stage interconnect 404 provides 144 signals from routing structure 402 to second switch matrices 408. Second switch matrices 408 of two-stage interconnect 404 provides 36 input signals to each logic block 412 within corresponding cluster 410. The 36 input signals may be selected from the 144 signals from first switch matrix 406, 64 local feedback signals from the 64 macrocells (i.e., 16 macrocells per logic block 412, with each macrocell providing a local feedback signal) within cluster 410, and 32 I/O signals from I/O pins 414.

If logic blocks 412 are cascadable (i.e., from 36 to 72, 104, or 144 inputs), cluster 410 can function, for example, as a 144 input/16 macrocell logic block, a 108 input/16 macrocell logic block and a 36 input/16 macrocell logic block, two 72 input/16 macrocell logic blocks, or as four 36 input/16 macrocell logic blocks. Consequently, two-stage interconnect architecture may provide interconnect efficiencies that are typically associated with large logic blocks (e.g., a 144 input/16 macrocell logic block) while providing array efficiencies that are typically associated with small logic blocks (e.g., a 36 input/16 macrocell logic block).

Second switch matrices 408 are shown in FIG. 4 as providing an exemplary routability of approximately three-ways (i.e., 20*36/(144+64+32)=3). Second switch matrices 408 may also be a fully populated switch matrix, but this would require a large number of fuses and utilize a large amount of integrated circuit area. Therefore, for this specific example, two-stage interconnect 404 provides conceptually approximately nine-way routability (i.e., approximately three-way routability for first switch matrix 406 and conceptually approximately three-way routability for second switch matrix 408 for at least some of the signals for a combined nine-way routability) for signals from routing structure 402 to each logic block 412.

FIG. 4 illustrates an exemplary two-stage interconnect architecture 404, in accordance with an embodiment of the present invention, that would be directly applicable for the architecture discussed in reference to FIGS. 2b or 3 (i.e., four logic blocks 206 per cluster 212 or four logic blocks 336 per cluster 332, respectively). However, it should be understood that two-stage interconnect architecture 404 is not limiting and may be modified to support architectures having a different number of logic blocks (e.g., such as cluster 204 shown in FIG. 2a) for each two-stage interconnect within the logic device and possibly a different degree of routability. Further details regarding interconnect architectures may be found in U.S. patent application Ser. No. 10/428,888 entitled "Multi-Stage Interconnect Architecture for Complex Programmable Logic Devices" filed concurrently herewith, which is incorporated herein by reference in its entirety.

FIGS. 5a, 5b, and 5c illustrate exemplary cascading for cluster-based logic blocks in accordance with an embodiment of the present invention. Specifically, FIG. 5a illustrates product term cascading within a cluster 502 having four logic blocks 504. As an example, each logic block 504 has 16 macrocells and receives 36 inputs and generates 80 product terms. The product terms from each logic block 504 can be combined or cascaded with one or more logic blocks 504 within cluster 502 in a unidirectional or bidirectional fashion. For example, each logic block 504 can provide 80 product terms or two of logic blocks 504 can be cascaded to provide 160 product terms, three of logic blocks 504 can be cascaded to provide 240 product terms, or all of logic blocks 504 in cluster 502 can be cascaded to provide 320 product terms. Thus, the product terms of logic blocks 504 can be cascaded to provide logic depths of 80, 160, 240, or 320 product terms in various combinations.

FIGS. 5b and 5c illustrate input cascading within cluster 502. Specifically, FIG. 5b shows input cascading for two pairs of logic blocks 504, which each pair providing within cluster 502 a 72 input/16 macrocell logic block. It should be noted that the macrocells that are unused in creating the 72 input/16 macrocell logic block may still be utilized to provide logic based on their associated 36 inputs. For FIG. 5c, the inputs are cascaded for all of the logic blocks 504 within cluster 502 to provide a 144 input/16 macrocell logic block. Optionally, the macrocells that are not used by the 144 input/16 macrocell logic block may be used, for example, to provide three 36 input/0.16 macrocell logic blocks for each of their respective logic blocks 504.

Figure 6:
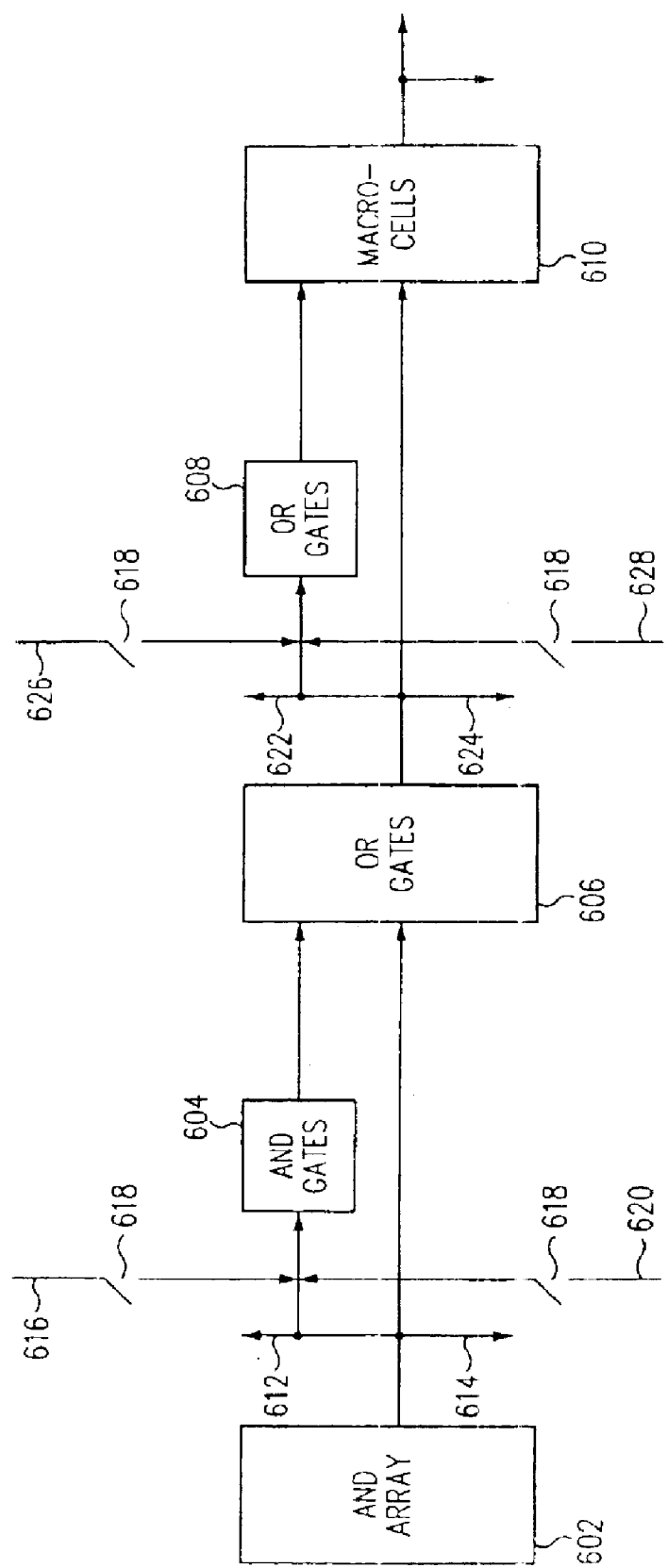
FIG. 6 shows a block diagram illustrating an exemplary logic block in accordance with an embodiment of the present invention.

FIG. 6 shows a block diagram illustrating an exemplary logic block 600 in accordance with an embodiment of the present invention. Logic block 600 may represent an exemplary implementation for logic block 504 (FIGS. 5a–5c), logic block 412 (FIG. 4), logic block 336 (FIG. 3), or logic block 206 (FIGS. 2a and 2b) and illustrates input cascading and product term cascading functionality.

Logic block 600 includes an AND array 602, AND gates 604, OR gates 606, OR gates 608, and macrocells 610. AND array 602 is programmable to receive a number of inputs and provide a number of product terms based on these inputs, with one or more of the product terms provided to AND gates 604 and/or OR gates 606 and also optionally to other logic blocks 600 (not shown) via leads 612 and 614 within a cluster that includes logic block 600 illustrated in FIG. 6.

AND gates 604 is used if input cascading is desired, with AND gates 604 utilized to logically AND product terms of logic block 600 with corresponding product terms (PT) from one or more other logic blocks within the cluster. For example, PT0 through PT79 of logic block 600 are logically combined (i.e., logical AND) with PT0 through PT79 of another logic block within the cluster, respectively, such that logic block 600 doubles its input width. The product terms from other logic blocks within the cluster may be selectively provided through leads 616 and/or 620 via corresponding switches 618. Thus, logic block 600 provides a flexible logic width capability.

OR gates 606 sums the product terms as desired from AND gates 604 and/or AND array 602 to provide one or more sums of product terms, which are provided to OR gates 608 and/or macrocells 610 and also optionally to other logic blocks 600 (not shown) via leads 622 and 624 within a cluster that includes logic block 600 illustrated in FIG. 6. OR gates 608 is used if product term cascading is desired, with OR gates 608 utilized to logically OR sums of product terms of logic block 600 with sums of product terms from one or more other logic blocks within the cluster. The sums of product terms from other logic blocks within the cluster may be selectively provided through leads 626 and/or 628 via corresponding switches 618. It should also be understood that OR gates 606 and OR gates 608 may be combined into one group of circuitry to perform their intended functions. Thus, logic block 600 provides a flexible logic depth capability.

Macrocells 610 receives the sum of product terms from OR gates 608 and/or OR gates 606 and provides the result to, for example, I/O terminals, a routing structure, or optionally to a local feedback path for the associated cluster. Further details regarding cascadable logic block architectures may be found, for example, in U.S. patent application Ser. No. 10/428,982 entitled "Programmable Logic Device With Enhanced Wide And Deep Logic Capability" filed concurrently herewith, which is incorporated herein by reference in its entirety.

In accordance with one or more embodiments of the present invention, a high performance CPLD architecture is disclosed that provides a scalable logic block architecture that may be supported by an interconnect architecture to provide an array fuse efficiency typically associated with a small logic block architecture and an interconnect fuse efficiency typically associated with a larger logic block architecture. The cascadable logic block architecture provides flexible width and/or depth capability to improve performance while possibly reducing routing congestion.

Embodiments described above illustrate but do not limit the invention. It should also be understood that numerous modifications and variations are possible in accordance with the principles of the present invention. For example, the principles of one or more embodiments of the present invention would also apply to other PLDs, such as programmable interconnect devices and field programmable gate arrays. Accordingly, the scope of the invention is defined only by the following claims.

We claim:

1. A programmable logic device comprising:
   a routing structure adapted to route signals within the programmable logic device;
   a plurality of logic blocks, coupled to the routing structure, adapted to provide flexible width and depth capability;
   wherein the plurality of logic blocks are arranged into a plurality of clusters, with each cluster having at least two of the logic blocks; and
   a plurality of multi-stage interconnects, coupled to the routing structure and to corresponding ones of the plurality of clusters, adapted to route signals from the routing structure to the logic blocks.

2. The programmable logic device of claim 1, wherein the flexible width and depth capability is provided among the logic blocks within each of the clusters, the logic blocks within each of the clusters having a cascadable number of inputs and product terms.

3. The programmable logic device of claim 2, wherein the cascadable number of product terms is unidirectional or bidirectional among the logic blocks within each of the clusters.

4. The programmable logic device of claim 2, wherein the logic blocks within each of the clusters are adapted to function as independent logic blocks or cascaded to function as a larger logic block having a programmable input width and a programmable number of product terms.

5. The programmable logic device of claim 1, wherein each of the logic blocks comprises:
   a programmable AND array adapted to receive a number of inputs and provide a number of product terms;
   a plurality of AND gates, coupled to the programmable AND array, adapted to provide input cascading with logic blocks within the cluster;
   a plurality of OR gates, coupled to the programmable AND array and the plurality of AND gates, adapted to sum product terms; and
   a second plurality of OR gates, coupled to the plurality of OR gates, adapted to sum product terms with logic blocks within the cluster.

6. The programmable logic device of claim 5, further comprising macrocells coupled to the plurality of OR gates and the second plurality of OR gates.

7. The programmable logic device of claim 6, wherein the plurality of OR gates and the second plurality of OR gates are combined to form an array of OR gates.

8. The programmable logic device of claim 1, wherein each of the two stage interconnects comprises:
   a first stage, coupled to the routing structure, having a partially populated switch matrix and adapted to programmably select a first set of signals from the routing structure; and
   a second stage, coupled to the first stage and to the logic blocks associated with the corresponding cluster, having a plurality of partially populated switch matrices, with each of the partially populated switch matrices in the second stage corresponding to one of the logic blocks in the corresponding cluster and adapted to programmably select from the first set of signals a second set of signals for the corresponding logic block.

9. The programmable logic device of claim 8, further comprising a plurality of input/output terminals couplable to the plurality of logic blocks to provide input/output signals, wherein the plurality of partially populated switch matrices in the second stage are further adapted to receive feedback signals from the logic blocks in the corresponding cluster or the input/output signals associated with the corresponding cluster, with the feedback signals and the input/output signals bypassing the routing structure and the first stage.

10. A cascadable logic block architecture within a programmable logic device comprising:
   a cluster of logic blocks, with each of the logic blocks adapted to provide a variable input width and/or a variable product term depth in conjunction with the remaining logic blocks within the cluster, wherein each of the logic blocks comprises:
   a programmable AND array adapted to receive input signals and provide a number of product terms;
   a plurality of AND gates, coupled to the programmable AND array, adapted to receive the product terms from the programmable AND array and from the logic blocks within the cluster and provide input cascading;
   a plurality of OR gates, coupled to the programmable AND array and the plurality of AND gates, adapted to sum product terms provided by the programmable AND array and/or the plurality of AND gates;
   a second plurality of OR gates, coupled to the plurality of OR gates, adapted to receive the sum of product terms from the plurality of OR gates and from the logic blocks with the cluster and provide product term cascading; and
   a plurality of macrocells, coupled to the plurality of OR gates and the second plurality of OR gates and adapted to receive their output signals.

11. The architecture of claim 10, wherein the cluster of logic blocks is replicated to form a plurality of clusters of logic blocks.

12. The architecture of claim 11, wherein each of the clusters of logic blocks is coupled to a routing structure via a two stage interconnect comprising:
   a first switch matrix, coupled to the routing structure, adapted to programmably select from a plurality of interconnect signals and provide a first set of output signals; and
   a plurality of second switch matrices, coupled between the first switch matrix and corresponding ones of the logic blocks within the cluster, adapted to programmably select from the first set of output signals and provide the input signals to corresponding ones of the logic blocks.

13. The architecture of claim 12, wherein the first switch matrix and the plurality of second switch matrices are partially populated switch matrices.

14. The architecture of claim 10, wherein the plurality of OR gates and the second plurality of OR gates are combined to form an array of OR gates.

15. A method of cascading logic blocks in a programmable logic device, the method comprising:

providing a plurality of logic blocks;

arranging the plurality of logic blocks into clusters, with at least two logic blocks per cluster;

providing an interconnect structure for each of the clusters to route input signals from a routing structure to the logic blocks; and adapting the logic blocks to have a programmable number of inputs and a programmable number of product terms by cascading the logic blocks within their cluster.

16. The method of claim 15, wherein the cascading of the product terms is unidirectional or bidirectional.

17. The method of claim 15, wherein the interconnect structure comprises a multi-stage interconnect.

18. The method of claim 15, wherein the interconnect structure comprises a multi-stage interconnect of partially populated switch matrices.

19. The method of claim 15, wherein the interconnect structure comprises a first and a second stage interconnect of partially populated switch matrices, with the second stage adapted to receive feedback signals from the logic blocks in the corresponding cluster which bypass the first stage.

20. The method of claim 15, further comprising:

sharing the product terms generated by the logic blocks among the logic blocks within their cluster to provide input cascading; and sharing a summation of the product terms among the logic blocks within their cluster to provide product term cascading.

* * * * *